(12) United States Patent
Choi et al.

(10) Patent No.: US 10,276,604 B2
(45) Date of Patent: Apr. 30, 2019

(54) DISPLAY PANEL AND DISPLAY DEVICE INCLUDING THE SAME

(71) Applicant: LG DISPLAY CO., LTD., Seoul (KR)

(72) Inventors: Jaeyeong Choi, Seoul (KR); ChongHun Park, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/248,897

(22) Filed: Aug. 26, 2016

(65) Prior Publication Data

US 2017/0062488 A1 Mar. 2, 2017

(30) Foreign Application Priority Data

Aug. 28, 2015 (KR) .................. 10-2015-0122105

(51) Int. Cl.
*H01L 27/12* (2006.01)
*H01L 27/32* (2006.01)

(52) U.S. Cl.
CPC ...... *H01L 27/1248* (2013.01); *H01L 27/1244* (2013.01); *H01L 27/3276* (2013.01)

(58) Field of Classification Search
CPC ............ H01L 27/1248; H01L 27/1244; H01L 27/3276; H01L 27/12
See application file for complete search history.

(56) References Cited

U.S. PATENT DOCUMENTS

| 2007/0287236 A1* | 12/2007 | Kim .................. H01L 29/41733 438/158 |
| 2013/0056724 A1* | 3/2013 | Chae .................. H01L 27/1225 257/43 |

* cited by examiner

*Primary Examiner* — Asok K Sarkar
*Assistant Examiner* — Dmitriy Yemelyanov
(74) *Attorney, Agent, or Firm* — Birch, Stewart, Kolasch & Birch, LLP

(57) ABSTRACT

There are provided a display panel and a display device including the same. In the display panel and display device including the same, in a structure in which an insulating layer having a depression point is provided between different conductive layers, another insulating layer may be disposed to cover the depression point. Accordingly, an occurrence of a short circuit may be minimized between the different conductive layers.

17 Claims, 9 Drawing Sheets

DISPLAY PANEL AND DISPLAY DEVICE INCLUDING THE SAME

CROSS-REFERENCE TO RELATED APPLICATIONS

This application claims priority to Korean Patent Application No. 10-2015-0122105, filed on Aug. 28, 2015, which is hereby incorporated by reference for all purposes as if fully set forth herein.

BACKGROUND OF THE INVENTION

Field of the Invention

The present invention relates to a display panel and a display device including the same.

Description of the Related Art

With the development of the information-oriented society, requirements for display devices for displaying images have been increased in various forms. In recent years, various display devices such as a liquid crystal display device, a plasma display device, and an organic light emitting display device, have been utilized.

The display device includes a lower substrate having a structure in which conductive layers made of a conductive material and insulating layers made of an insulating material are laminated and an upper substrate disposed opposite to the lower substrate.

In particular, in the structure in which the conductive layer and the insulating layers are laminated, when a step is present on the conductive layer, taper characteristics and interface characteristics of the insulating layer are not excellent, and as a result, non-uniformity in the thickness of the insulating layer at the time of being laminated or a cut-off failure of the insulating layer at an area corresponding to the step of the conductive layer frequently occurs.

As a result, different conductive layers contact each other at the area where the failure of the insulating layer occurs. Therefore, a short circuit occurs in an element. Accordingly, a scheme that can address this problem is needed.

SUMMARY OF THE INVENTION

An aspect of the present invention provides a display panel for suppressing a short circuit between a conductive layer and another conductive layer and a display device including the same.

According to aspects of the present invention, there are provided a display panel and a display device including the same, which each include a first conductive layer disposed on a substrate; a first insulating layer, a second conductive layer, and a second insulating layer sequentially disposed on the substrate and including step portions, respectively; a third insulating layer disposed on a part of the top of the second insulating layer; and a third conductive layer disposed on the substrate including the third insulating layer, in which each step portion includes a depression point and the third insulating layer is disposed to be overlapped with the depression point.

In this case, the third insulating layer may be further disposed in a first direction from the depression point. Further, the third insulating layer may be configured to be flat at an area corresponding to the step portion of the second insulating layer and residual areas other than the area corresponding to the step portion.

The thickness of the third insulating layer disposed at the area overlapped with the depression point may be larger than the thickness of the third insulating layer disposed in a second direction from the depression point.

As set forth above, according to the exemplary embodiments of the present invention, in a display panel and a display device including the same, another insulating layer is disposed so as to overlap with a depression point of an insulating layer to suppress a short circuit from being occurred between conductive layers.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
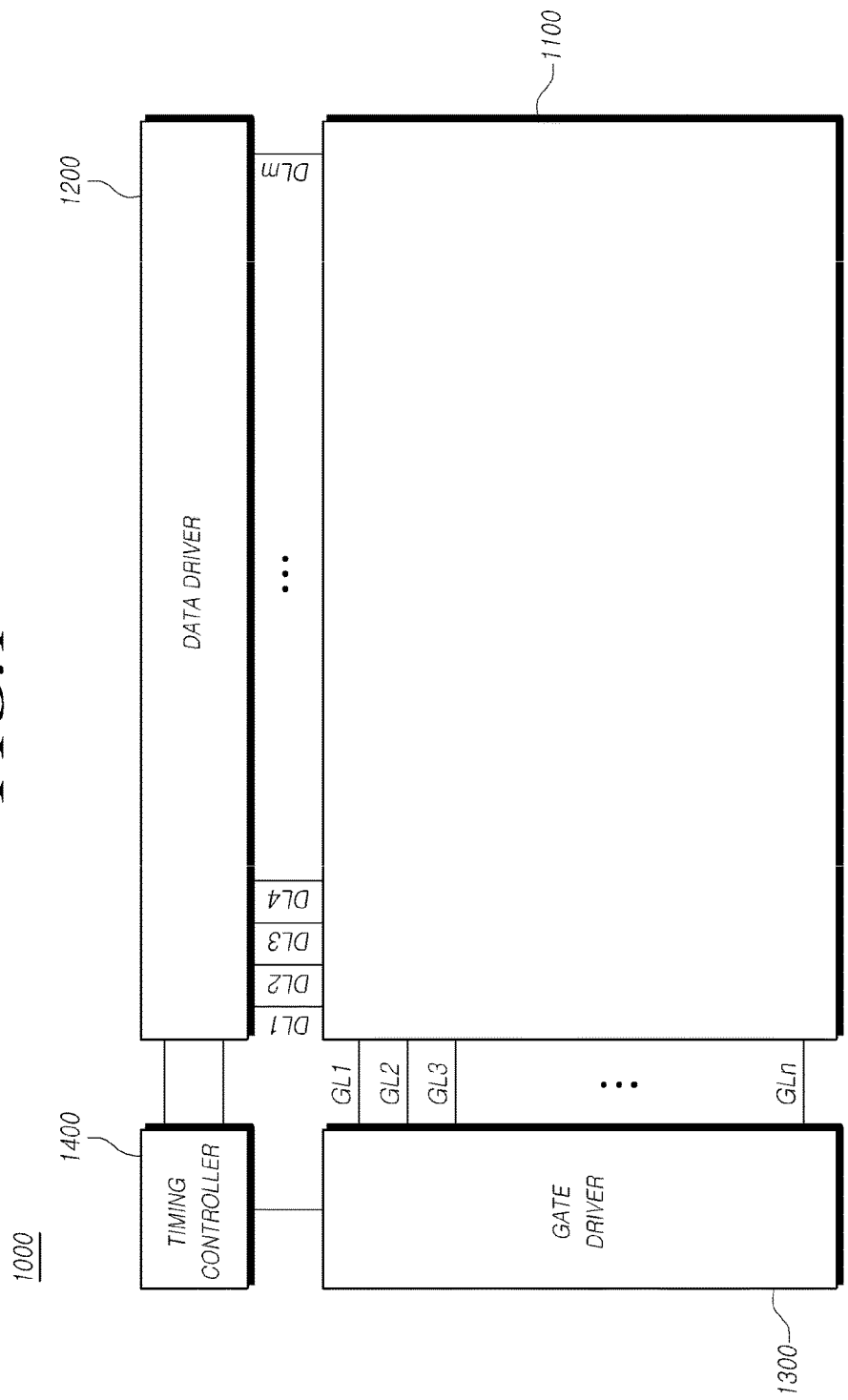
FIG. 1 is a schematic system configuration diagram of a display device according to exemplary embodiments of the present invention.

Hereinafter, exemplary embodiments of the present invention will be described with reference to the drawings. The following introduced exemplary embodiments are provided as examples so that the present invention will fully convey the spirit of the present invention to those skilled in the art. Accordingly, the present invention is not limited to exemplary embodiments described below, but materialized in another form. In addition, in the drawings, the size and the thickness of an apparatus may be exaggerated and expressed for easy description. Like reference numerals designate like elements throughout the specification.

The advantages and features of the present invention, and a method of accomplishing these will become obvious with reference to embodiments to be described below in detail along with the accompanying drawings. However, the present invention is not limited to the exemplary embodiments set forth below, and may be embodied in various different forms. The present exemplary embodiments are just for rendering the description of the present invention complete and are set forth to provide a complete understanding of the scope of the invention to a person with ordinary skill in the technical field to which the present invention pertains, and the present invention will only be defined by the scope of the claims. Like reference numerals denote like elements throughout the present specification. The sizes and relative sizes of layers and areas marked in the drawings may be exaggerated for clarity of description.

When an element or layer is referred to as being "on" another element or layer, it may be directly on the other element or layer, or intervening elements or layers may be present. On the contrary, designating that the elements are "directly on" or "just above" represents the case where other elements or layers are not interposed therebetween.

"Below", "beneath", "lower", "above", "upper", and the like which are spatially relative terms may be used to easily describe correlation between one element or component and other elements or components as illustrated in the drawings. The spatially relative terms should be appreciated as terms including different directions of the element in use or operation in addition to directions illustrated in the drawings. For example, when an element illustrated in the drawings is turned over, an element described to be "below" or "beneath" other elements may be laid "above" other elements. Accordingly, "below" which is an exemplary term may include both upper and lower directions.

Further, terms such as first, second, A, B, (a), (b), and the like may be used in describing the components of the exemplary embodiments according to the present invention. The terms are only used to distinguish a component from another component, but nature and an order of the component or the number of the components is not limited by the terms.

FIG. 1 is a schematic system configuration diagram of a display device according to exemplary embodiments of the present invention. All the components of the display device according to all the embodiments of the present invention are operatively coupled and configured.

Referring to FIG. 1, the display device 1000 according to the exemplary embodiments includes a display panel 1100 where a plurality of data lines DL to DLm and a plurality of gate lines GL1 to GLn are disposed and a plurality of sub pixels is disposed, a data driver 1200 driving the plurality of data lines DL to DLm, a gate driver 1300 driving the plurality of gate lines GL1 to GLn, and a timing controller 1400 controlling the data driver 1200 and the gate driver 1300.

The data driver 1200 supplies data voltage to the plurality of data lines to drive the plurality of data lines. In addition, the gate driver 1300 sequentially supplies a scan signal to the plurality of gate lines to sequentially drive the plurality of gate lines.

Further, the timing controller 1400 supplies a control signal to the data driver 1200 and the gate driver 1300 to control the data driver 1200 and the gate driver 1300. The timing controller 1400 starts scanning according to a timing implemented in each frame, converts input image data input from the outside according to a data signal format used in the data driver 1200 to output the converted image data, and controls data driving at an appropriate time according to the scanning.

The gate driver 1300 sequentially supplies a scan signal of on voltage or off voltage according to the control of the timing controller 1400 to the plurality of gate lines to sequentially drive the plurality of gate lines. Further, the gate driver 1300 may be positioned only at one side of the display panel 1100 or may be positioned at both sides thereof in some cases, as illustrated in FIG. 1, according to a driving mode or a design type of the display panel.

Further, the gate driver 1300 may include one or more gate driver integrated circuits. Each gate driver integrated circuit may be connected to a bonding pad of the display panel 1100 by a tape automated bonding (TAB) method or a chip on glass (COG) method or may be implemented by a gate in panel (GIP) type to be directly disposed on the display panel 1100, and in some cases, may be integrated and disposed on the display panel 1100.

Further, each gate driver integrated circuit may be implemented by a chip on film (COF) method. In this case, a gate driving chip corresponding to each gate driver integrated circuit may be mounted on a flexible film and one end of the flexible film may be bonded to the display panel 1100.

The data driver 1200 converts the image data received from the timing controller 1400 into analog type data voltage and supplies the analog type data voltage to the plurality of data lines when a specific gate line is opened to drive the plurality of data lines. In addition, the data driver 1200 may include at least one source driver integrated circuit to drive the plurality of data lines.

Each source driver integrated circuit may be connected to the bonding pad of the display panel 1100 by the tape automated bonding (TAB) method or the chip on glass (COG) method or directly disposed on the display panel 1100, and in some cases, may be integrated and disposed on the display panel 1100.

Further, each source driver integrated circuit may be implemented by the chip on film (COF) method. In this case, a source driving chip corresponding to each source driver integrated circuit is mounted on the flexible film, one end of the flexible film is bonded to at least one source printed circuit board, and the other end thereof is bonded to the display panel 1100.

The source printed circuit board is connected with a control printed circuit board through a connection medium such as a flexible flat cable (FFC) or a flexible printed circuit (FPC). The timing controller 1400 is disposed on the control printed circuit board.

Further, in the control printed circuit board, a power controller which supplies voltage or current to the display panel 1100, the data driver 1200, and the gate driver 1300 or controls the voltage or the current to be supplied may be further disposed. The source printed circuit board and the control printed circuit board which are described above may be one printed circuit board.

Meanwhile, the display device 1000 may be a liquid crystal display device, an organic light emitting display device, and the like. The display devices include a lower substrate in which a structure in which an insulating layer is disposed on a conductive layer and another conductive layer is disposed on the insulating layer is repeated.

In the lower substrate having such a structure, a depression point is generated on the insulating layer due to a step by the conductive layer. When another conductive layer is disposed at the depression point, the corresponding conductive layer contacts a conductive layer disposed below the insulating layer, and as a result, a minute short circuit (or a short circuit of a brief/short time period) occurs.

Hereinafter, in exemplary embodiments to be described below, the organic light emitting display device among the display devices will be primarily described, but the exemplary embodiments of the present invention are not limited thereto and the exemplary embodiments may be applied to all display devices including the lower substrate in which the structure in which the insulating layer is disposed on the conductive layer and another conductive layer is disposed on the insulating layer is repeated.

Figure 2:
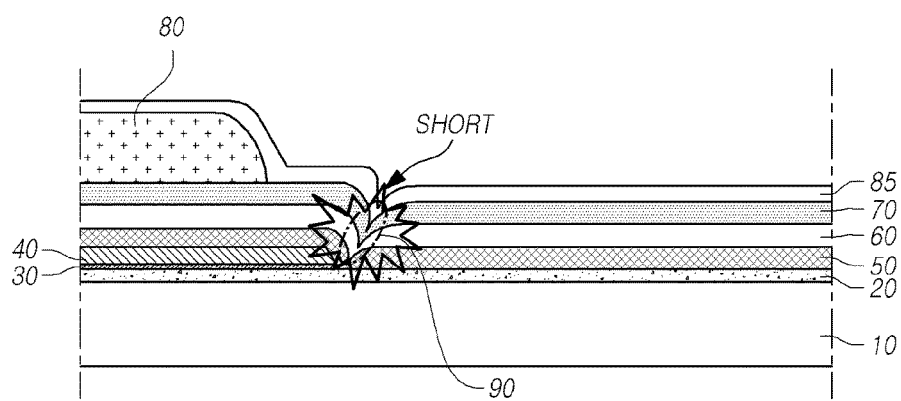
FIG. 2 is a cross-sectional view illustrating a structure in which a minute short circuit occurs between different conductive layers.

FIG. 2 is a cross-sectional view illustrating a structure in which a minute short circuit occurs between different conductive layers. Referring to FIG. 2, a first insulating layer 20 is disposed on a substrate 10 and a second insulating layer 30 and a first conductive layer 40 are sequentially disposed on a part of the top of the first insulating layer 20.

Further, a third insulating layer 50 is disposed on the first conductive layer 40 and a second conductive layer 60 and a fourth insulating layer 70 are disposed on the third insulating layer 50. A fifth insulating layer 80 is disposed on a part of the top of the fourth insulting layer 70 and a third conductive layer 85 is disposed on the substrate 10 including the fifth insulating layer 80.

Herein, the second insulating layer 30 and the first conductive layer 40 have a step, and as a result, a depression point 90 is generated on the third insulating layer 50 disposed on the first conductive layer 40 due to the step. Further, the depression point 90 is formed on the third insulating layer 50, and as a result, the depression points 90 are generated even on the second conductive layer 60, the fourth insulating layer 70, and the third conductive layer 85, which are disposed later.

In this case, the fifth insulating layer 80 is disposed on a part of the top of the fourth insulating layer 70, and as a result, the depression point 90 may not be generated on the fifth insulating layer 80. In other words, the fifth insulating layer 80 is not extended and disposed up to the depression point 90 of the fourth insulating layer 70, and as a result, the depression point 90 is not generated on the fifth insulating layer 80.

Meanwhile, the second conductive layer 60 and the third conductive layer 85 may contact each other due to the depression point generated on the fourth insulating layer 70. In other words, the fifth insulating layer 80 is not disposed up to the depression point 90 of the fourth insulating layer 70, and as a result, the third conductive layer 85 is disposed at the depression point 90 of the fourth insulating layer 70. As a result, a minute short circuit of the second conductive layer 60 and the third conductive layer 85 may occur.

Figure 3:
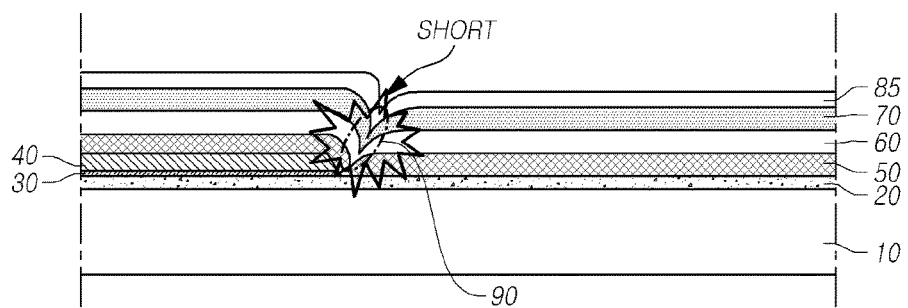
FIG. 3 is a cross-sectional view illustrating another structure in which a minute short circuit occurs between different conductive layers.

FIG. 3 is a cross-sectional view illustrating another structure in which a minute short circuit occurs between different conductive layers. Referring to FIG. 3, the first insulating layer 20 is disposed on the substrate 10, the second insulating layer 30 and the first conductive layer 40 are disposed on a part of the top of the first insulating layer 20, the third insulating layer 50 is disposed on the first conductive layer 40, and the second conductive layer 60 and the fourth insulating layer 70 are disposed on the third insulating layer 50.

In addition, the third conductive layer 85 is disposed on the fourth insulating layer 70. In this case, depression points 96 are generated on the third insulating layer 50, the second conductive layer 60, the fourth insulating layer 70, and the third conductive layer 85 due to the step of the second insulating layer 30 and the first conductive layer 40.

Herein, the second conductive layer 60 and the third conductive layer 85 contact each other due to the depression points 96, and as a result, the short circuit of the second conductive layer 60 and the third conductive layer 85 may occur.

Hereinafter, the exemplary embodiments of the present invention intend to present a configuration to suppress the minute short circuit between different conductive layers.

Figure 4A:
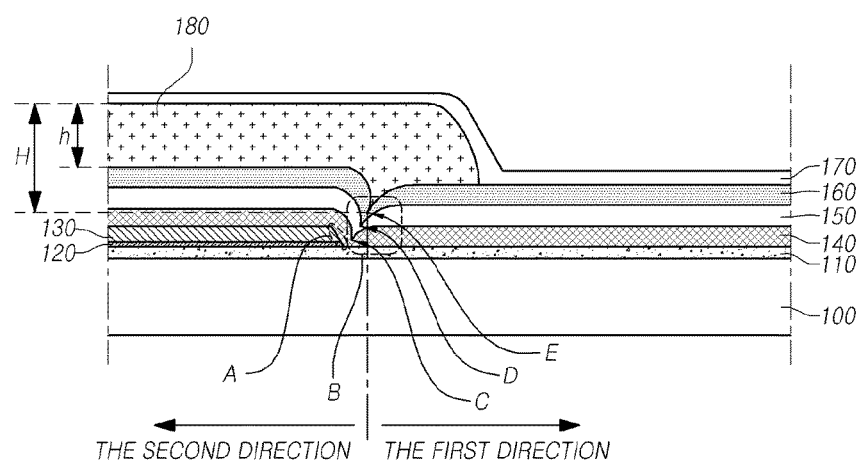
FIG. 4A is a cross-sectional view illustrating a lower substrate structure of a display device according to an exemplary embodiment of the present invention.
Figure 4B:
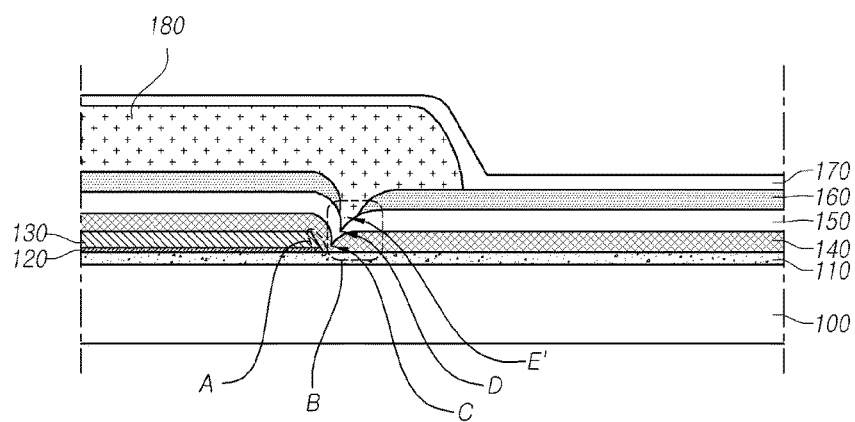
FIG. 4B is a cross-sectional view illustrating a lower substrate structure of a display device according to another exemplary embodiment of the present invention.

FIG. 4A is a cross-sectional view illustrating a lower substrate structure of a display device according to an exemplary embodiment of the present invention. FIG. 4B is a cross-sectional view illustrating a lower substrate structure of a display device according to another exemplary embodiment of the present invention.

The display devices according to the exemplary embodiments of the present invention may include the same or similar component(s) and thus a duplicated description with the aforementioned exemplary embodiment may be omitted or may be brief. Further, like components have like reference numerals.

First, referring to FIG. 4A, the display device according to the exemplary embodiment of the present invention includes a substrate 100, a first conductive layer 130, a first insulating layer 140, a second conductive layer 150, a second insulating layer 160, a third insulating layer 180, and a third conductive layer 170.

In detail, a buffer layer 110 is disposed on the substrate 100. A protective layer 120 and the first conductive layer 130 are disposed on the buffer layer 110. Herein, in FIGS. 4A and 4B, a configuration in which the buffer layer 110 is disposed on the substrate 100 is disclosed, but a structure of the substrate 100 of the display device according to the exemplary embodiment of the present invention is not limited thereto and may include a configuration in which the buffer layer 110 is not disposed on the substrate 100 and the protective layer 120 is disposed to contact on the substrate 100.

Meanwhile, the protective layer 120 and the first conductive layer 130 may be disposed only on a partial area of the substrate 100. Therefore, the protective layer 120 and the first conductive layer 130 may be configured to have a step A. In this case, in FIGS. 4A and 4B, the configuration in which the protective layer 120 is configured to have the step A similarly to the first conductive layer 130 is illustrated, but the present invention is not limited thereto and includes a structure in which the protective layer 120 is disposed on a front surface of the substrate 100 and only the first conductive layer 130 is configured to have the step A.

The first insulating layer 140, the second conductive layer 150, and the second insulating layer 160 are sequentially disposed on the substrate 100 including the first conductive layer 130. In this case, the first insulating layer 140, the second conductive layer 150, and the second insulating layer 160 are disposed along the step A of the protective layer 120 and the first conductive layer 130, and as a result, a step portion B is generated at an area corresponding to the step A of the protective layer 120 and the first conductive layer 130 even on the first insulating layer 140, the second conductive layer 150, and the second insulating layer 160.

In this case, the first insulating layer 140 and the second insulating layer 160 may be made of an inorganic insulating material. For example, the first insulating layer 140 and the second insulating layer 160 may be made of silicon oxide ($SiO_2$), silicon nitride (SiNx), aluminum oxide ($Al_2O_3$), hafnium oxide ($HfO_2$), and the like. However, the materials of the first insulating layer 140 and the second insulating layer 160 are not limited thereto and the first insulating layer 140 and the second insulating layer 160 are enough to be made of an inorganic insulating material.

As described above, the first and second insulating layers 140 and 160 are made of the inorganic insulating material, and as a result, the step portion B is formed on the first insulating layer 140 along the step A of the first conductive layer 130. Moreover, the step portion B may be formed on the second conductive layer 150 along the step portion B of the first insulating layer 140 and the step portion B may be formed on the second insulating layer 160 along the step portion B of the second conductive layer 150.

Herein, the second conductive layer 150 may be formed by laminating at least one of copper (Cu), molybdenum (Mo), aluminum (Al), silver (Ag), titanium (Ti), or alloys composed of a combination thereof. However, the material of the first conductive layer 150 is not limited thereto and the first conductive layer 150 is enough to be made of a conductive material having low resistance.

Meanwhile, a first depression point C of the first insulating layer 140, a second depression point D of the second conductive layer 150, and a third depression point E of the second insulating layer 160 are formed at the step portion B of the first insulating layer 140, the second conductive layer 150, and the second insulating layer 160. In detail, the first depression point C of the first insulating layer 140, the second depression point D of the second conductive layer 150, and the third depression point E of the second insulating layer 160 may be generated at the step portion B of the first insulating layer 140, the second conductive layer 150, and the second insulating layer 160 by the step A of the protective layer 120 and the first conductive layer 130.

Herein, the first insulating layer 140 and the second insulating layer 160 may have the smallest thickness at the first depression point C of the first insulating layer 140 and the third depression point E of the second insulating layer 160. In detail, since the first insulating layer 140 and the second insulating layer 160 are made of the inorganic insulating material, taper characteristics and interface characteristics may not be excellent. Therefore, when the first insulating layer 140 and the second insulating layer 160 are laminated, thickness non-uniformity (non-uniform thickness) occurs at the area corresponding to the step A of the first conductive layer 130.

Meanwhile, the third conductive layer 180 is disposed on a part of the top of the second insulating layer 160. Herein, the third insulating layer 180 may be further disposed in a first direction from the third depression point E of the second insulating layer 160. That is, the third insulating layer 180 may be disposed to cover the third depression point E of the second insulating layer 160.

In this case, the third insulating layer 180 may be made of the organic insulating material. For example, the third insulating layer 180 may be made of benzocyclobutene (BCB), photoacryl, and the like. However, the material of the third conductive layer 180 is not limited thereto and the third insulating layer 180 is enough to be made of the organic insulating material.

In this case, the third insulating layer 180 is made of the organic insulating material, and as a result, the third insulating layer 180 may be formed to be flat on the second insulating layer 160. In detail, the third insulating layer 180 made of the organic insulating material is characteristically formed to be flat even at an area where the step, and the like are present. As a result, the third insulating layer 180 may be formed to be flat at an area corresponding to the step portion B of the second insulating layer 160 and even residual areas other than the area corresponding to the step portion B. Further, the third insulating layer 3 may be formed to be flat at an area corresponding to the third depression point E of the second insulating layer 160 and even residual areas other than the area corresponding to the third depression point E.

Therefore, the third conductive layer 170 disposed on the third insulating layer 180 may also be formed to be flat. For example, when the exemplary embodiment of the present invention is applied to the organic light emitting display device, the third insulating layer 180 is formed to be flat, and as a result, an organic emission layer disposed on the third conductive layer 170 may also be formed to be flat.

Further, the thickness of the third insulating layer 180 may be larger than the thickness of the second insulating layer 160. Therefore, the third insulating layer 180 may be formed to have a sufficient thickness even at the step portion B of the second insulating layer 160.

Further, a thickness H of the third insulating layer 180 disposed at an area overlapped with the third depression point E of the second insulating layer 160 may be larger than a thickness h of the third insulating layer 180 disposed in a second direction which is an opposite direction to the first direction from the third depression point E of the second insulating layer 160. Therefore, the third insulating layer 180 may be disposed at the third depression point E of the second insulating layer 160, which has a sufficient thickness and even though the second insulating layer 160 has the third depression point E, the third insulating layer 180 may be formed to be flat on the second insulating layer 160.

The third conductive layer 170 is disposed on the substrate 100 including the third insulating layer 180. The third conductive layer 170 may be made of a transparent conductive material. For example, the third conductive layer 170 may be made of any one of indium tin oxide (ITO), indium zinc oxide (IZO), and indium tin zinc oxide (ITZO). However, the material of the third conductive layer 170 is not limited thereto and the third insulating layer 170 is enough to be made of the transparent conductive material.

Meanwhile, the thickness of the third insulating layer 180 is configured to be larger than the thickness of the second insulating layer 160 and the thickness H of the third insulating layer 180 disposed to be overlapped with the third depression point E of the second insulating layer 160 is configured to be larger than a thickness h of the third insulating layer 180 disposed in the second direction which is the opposite direction to the first direction from the third depression point E of the second insulating layer 160, and as a result, the third insulating layer 180 may sufficiently fill the third depression point E of the second insulating layer 160.

In this case, the third insulating layer 180 has the sufficient thickness at the step portion B and the third depression point E of the second insulating layer 160 to suppress the minute short circuit between the second conductive layer 150 and the third conductive layer 170 at the third depression point E of the second insulating layer 180.

In other words, the third insulating layer 180 is further disposed in the first direction from the third depression point E of the second insulating layer 160 and the third insulating layer 180 is formed on the third depression point E of the second insulating layer 160 with the sufficient thickness, and as a result, the minute short circuit of the second conductive layer 150 and the third conductive layer 170 may be suppressed even though the thickness of the second insulating layer 160 is the smallest at the third depression point E of the second insulating layer 160.

Meanwhile, in FIG. 4B, an exemplary embodiment in which the second insulating layer 160 is not formed at a third depression point E' of the second insulating layer 160 is illustrated. In this case, the second insulating layer 160 may include a non-disposed area of the second insulating layer 160 at the third depression point E' by the step portion B of the second conductive layer 150, which occurs due to the step A of the first conductive layer 130.

In this case, the third insulating layer 180 is disposed at the third depression point E' where the second insulating layer 160 is not disposed to suppress the second conductive layer 150 and the third conductive layer 170 from contacting each other.

As described in the exemplary embodiments of the present invention, the third conductive layer 170 is disposed to be overlapped with the depression points E and E' of the second insulating layer 160 to suppress the short circuit due to contact between the second conductive layer 150 and the third conductive layer 170.

Figure 5:
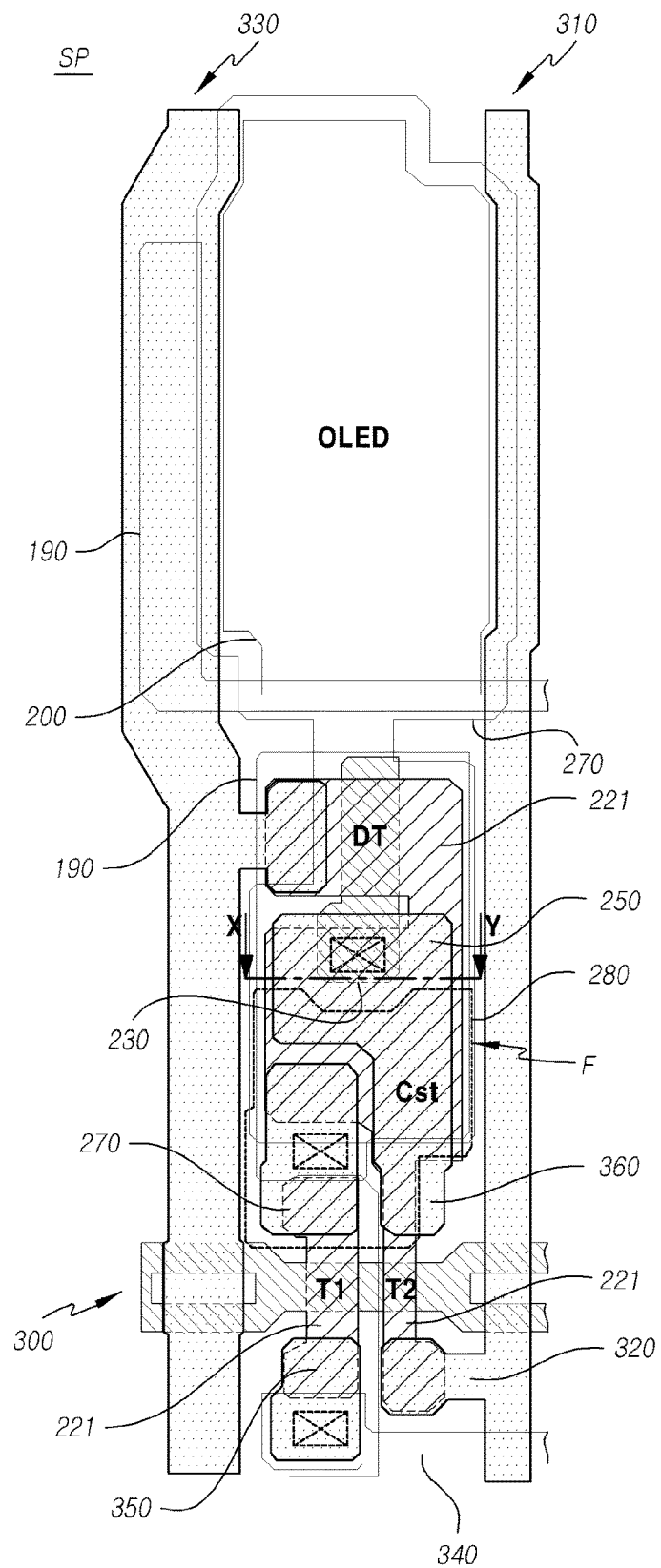
FIG. 5 is a cross-sectional view illustrating one sub pixel in a display panel according to an exemplary embodiment of the present invention.

Subsequently, a cross-sectional view of a display panel according to an exemplary embodiment of the present invention will be described below with reference to FIG. 5. FIG. 5 is a cross-sectional view illustrating one sub pixel in a display panel according to an exemplary embodiment of the present invention.

Referring to FIG. 5, one sub pixel SP of the display panel according to the exemplary embodiment of the present invention is defined by crossing a gate line 300 and a data line 310. A sub pixel SP1 may include a driving transistor DT, a first transistor T1, a second transistor T3, one storage capacitor Cst, and one organic light emitting diode OLED.

In detail, the second transistor T2 is controlled by a scan signal supplied from the gate line 300 and is supplied with data voltage from the data line 310. The first transistor T1 is controlled by the scan signal supplied from the gate line 300 and is supplied with reference voltage Vref from a first wire 350 connected with a reference voltage line 340.

Further, the second transistor T2 is controlled by the scan signal supplied from the gate line 300 and is supplied with the data voltage from a second wire 320 connected with the data line 310. The second transistor T2 is connected with a plate 240 through a first contact hole 360 and the plate 140 is connected with a gate electrode 230 of the driving transistor DT through a second contact hole 210. In this case, the plate 240 may be made of the same material as the data line 310.

The driving transistor DT is controlled by voltage applied to the gate electrode 230 and the driving transistor DT is applied with driving voltage EVDD from a driving voltage line 330 through a drain node thereof and outputs current through a source node thereof.

Meanwhile, FIG. 5 assumes that the driving transistor DT is designed in an oxide transistor structure and an active layer 221 is disposed in order to form the source node of the driving transistor DT and the source node of the first transistor T1. The active layer 121 may form a storage capacitor Cstg together with the plate 240 connected with the second transistor T2. Further, a light shield LS 190 may be disposed in the sub pixel SP in order to protect a circuit such as a transistor, and the like.

In addition, a first electrode 270 of the organic light emitting diode OLED connected with the drain electrode of the driving transistor DT through a contact hole is disposed. A part of the top of the first electrode 270 of the organic light emitting diode OLED may be exposed by a bank pattern 200. An organic emission layer of the organic light emitting diode OLED may be disposed on the exposed top of the first electrode 270 and a second electrode of the organic light emitting diode OLED may be disposed on the substrate where the organic emission layer is disposed.

In this case, an overcoat layer 280 may be disposed at an area where the gate electrode 130, the active layer 221, and the plate 240 of the driving transistor DT and the first electrode 270 of the organic light emitting diode OLED overlap with each other. In other words, the overcoat layer 280 may be disposed at an area other than area F illustrated in FIG. 5. Such a configuration will be described below in detail with reference to FIG. 6.

Figure 6:
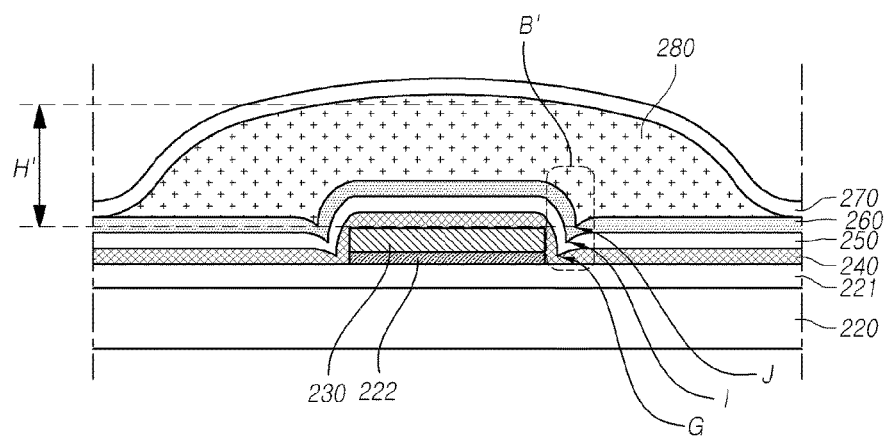
FIG. 6 is a cross-sectional view taken along line X-Y of the plan view of FIG. 5.

FIG. 6 is a cross-sectional view taken along line X-Y of the plan view of FIG. 5. Referring to FIG. 6, the active layer 221 is disposed on a substrate 220. A gate insulating layer 222 is disposed on the active layer 221. A gate electrode 230 is disposed on the gate insulating layer 222. An inter-layer insulating layer 240 is disposed on the gate electrode 230 and a plate 250 is disposed on the inter-layer insulating layer 240. A protective layer 260 is disposed on the plate 250 and the overcoat layer 280 is disposed on the protective layer 260. The first electrode 270 of the organic light emitting diode is disposed on the overcoat layer 280.

Herein, the gate electrode 230 may be formed to have the step on the substrate 220. Even in the inter-layer insulating layer 240, the plate 250, and the protective layer 260 to be disposed later, a step portion B' may be formed at an area corresponding to an area where the step of the gate electrode 230 is formed due to the step of the gate electrode 230.

A first depression point G of the inter-layer insulating layer 240, a second depression point I of the plate 250, and a third depression point J of the protective layer 260 may be formed at the step portion B'. In this case, the inter-layer insulating layer 240 and the protective layer 260 may have the smallest thickness at the depression points G and J, respectively.

Meanwhile, the overcoat layer 280 may be disposed on the protective layer 260 so as to cover the third depression point J of the protective layer 260. Herein, a thickness H' of the overcoat layer 280 may be the largest at the third depression point J. Therefore, in the first electrode 270 and the plate 250 of the organic light emitting diode disposed on the overcoat layer 280, the minute short circuit may be suppressed by the third depression point J of the protective layer 260.

Figure 7:
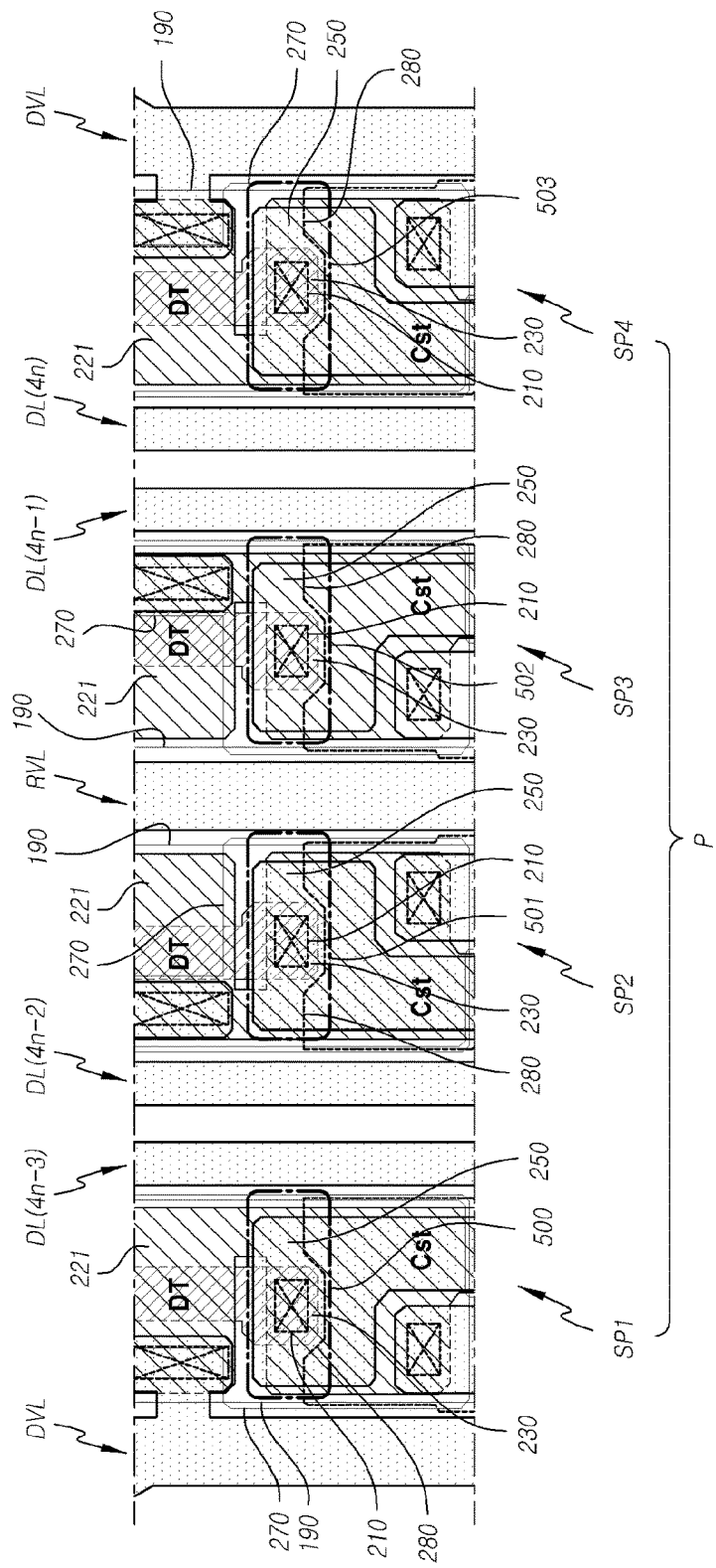
FIG. 7 is a plan view briefly illustrating one pixel in a display panel according to an exemplary embodiment of the present invention.

FIG. 7 is a plan view briefly illustrating one pixel in a display panel according to an exemplary embodiment of the present invention. Further, FIG. 8 is an equivalent circuit diagram of the display panel illustrated in FIG. 7.

Figure 8:
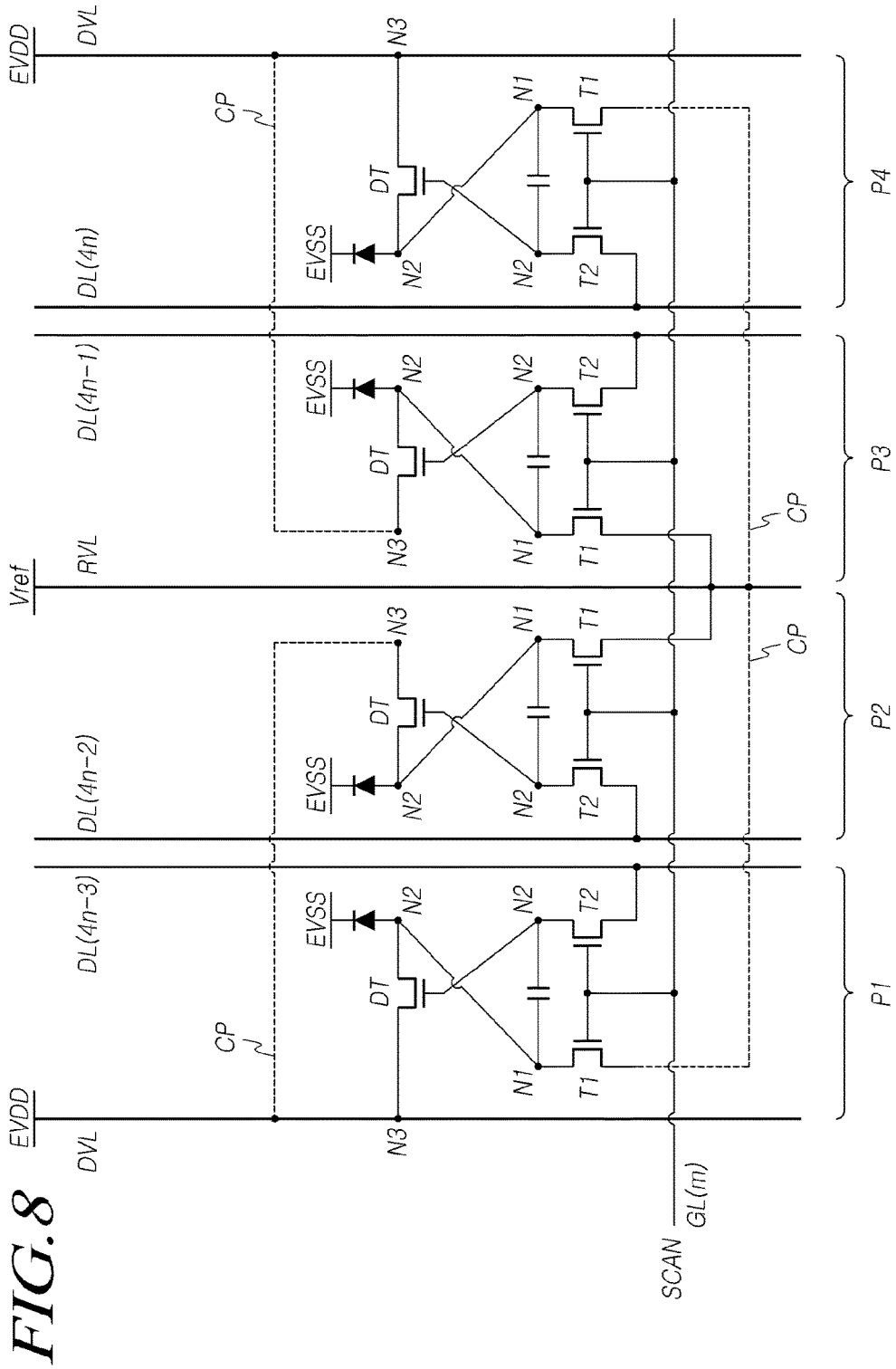
FIG. 8 is an equivalent circuit diagram of the display panel illustrated in FIG. 7.

Referring to FIGS. 7 and 8, in the display panel according to the exemplary embodiment of the present invention, one pixel P may include four sub pixels SP1, SP2, SP3, and SP4. However, a pixel structure of the display panel is not limited thereto and the exemplary embodiment of the present invention may be applied even to a structure in which one pixel P may include three sub pixels.

In FIGS. 7 and 8, with respect to a case in which a basic unit of a signal line connection structure is four pixels P1 to P4 connected to four data lines DL(4n-3), DL(4n-2), DL(4n-1), and DL(4n), a basic pixel structure of a 3T1C based 1 scan structure and a signal line connection structure may be verified.

In this case, the four data lines DL(4n-3), DL(4n-2), DL(4n-1), and DL(4n) are connected to four sub pixels SP1, SP2, SP3, and SP4, respectively. Further, one gate line is connected to four pixels P1 to P4.

Further, as illustrated in FIG. 2, four respective sub pixels SP1, SP2, SP3, and SP4 connected with four data lines DL(4n-3), DL(4n-2), DL(4n-1), and DL(4n) similarly include a driving transistor DT driving the organic light emitting diode by receiving the driving voltage EVDD, a first transistor DL receiving the reference voltage Vref and transferring the received reference voltage Vref to a first node of the driving transistor DT, a second transistor T2 receiving data voltage Vdata and transferring the received data voltage Vdata to a second node N2 of the driving transistor DT, and a capacitor Cst connected between the first node N1 and the second node N2 of the driving transistor DT.

Meanwhile, even though four respective sub pixels SP1, SP2, SP3, and SP4 connected with four data lines DL(4n-3), DL(4n-2), DL(4n-1), and DL(4n) are the same as each other in terms of the numbers of transistors and capacitors, the number of scan signals, and the like, four respective sub pixels SP1, SP2, SP3, and SP4 may be different from each other in terms of the signal line connection structure (signal applying scheme) for receiving data voltage, driving voltage, and reference voltage.

In the display panel having such a configuration, the overcoat layer 280 may be disposed at areas 500, 501, 502, and 503 where the gate electrode 230, the active layer 221, and the plate 250 of the driving transistor DT and the first electrode 270 of the organic light emitting diode are overlap and disposed, which are disposed in four sub pixels SP1, SP2, SP3, and SP4, respectively. In other words, the overcoat layer 280 may be disposed at an area other than areas F illustrated in FIG. 7 in each of the sub pixels SP1, SP2, SP3, and SP4.

Therefore, by the gate electrode 230, a protective layer disposed on the plate 250 includes a depression point having a very small thickness to suppress the plate 250 and the first electrode 270 of the organic light emitting diode from minutely contacting each other.

By explaining it again, the plate 250 and the first electrode 270 of the organic light emitting diode may contact each other through the depression point of the protective layer, but the overcoat layer 280 is disposed between the protective layer and the first electrode 270 of the organic light emitting diode to suppress the plate 250 and the first electrode 270 of the organic light emitting diode from contacting each other.

However, an application range of the exemplary embodiments of the present invention is not limited thereto and in all structures including an insulating layer having the depression point between different conductive layers, another insulating layer may be disposed so as to cover the depression point on the insulating layer as described in the exemplary embodiments of the present invention. Accordingly, the short circuit may be suppressed from being occurred between different conductive layers.

Features, structures, effects, and the like described in the aforementioned exemplary embodiments are included in at least one exemplary embodiment of the present invention and is not particularly limited to only one exemplary embodiment. Furthermore, the feature, the structure, the effect, and the like exemplified in each exemplary embodiment are combined or modified to be executed even with respect to other exemplary embodiments by those skilled in the art to which the exemplary embodiments pertain. Therefore, it should be construed that contents associated with the combination and modification are included in the scope of the present invention.

In the above description, the present invention has been described based on the exemplary embodiments, but the exemplary embodiments are for illustrative, and do not limit the present invention, and those skilled in the art will appreciate that various modifications and applications, which are not exemplified in the above description, may be made without departing from the scope of the essential characteristic of the present exemplary embodiments. For example, each component described in detail in the exemplary embodiment can be modified and executed.

What is claimed is:

1. A display panel comprising:
    a substrate;
    a first conductive layer disposed on the substrate;
    a first insulating layer, a second conductive layer, and a second insulating layer sequentially disposed on the substrate and including step portions, respectively;
    a third insulating layer disposed on a part of a top of the second insulating layer; and
    a third conductive layer disposed on the substrate including the third insulating layer,
    wherein the step portions include a depression point, and the third insulating layer is disposed to overlap the depression point, and
    wherein the second insulating layer includes a breakage at the depression point.

2. The display panel of claim 1, wherein the third insulating layer is further disposed in a first direction from the depression point.

3. The display panel of claim 1, wherein the third insulating layer is configured to be flat at an area corresponding to the step portion of the second insulating layer and residual areas other than the area corresponding to the step portion.

4. The display panel of claim 1, wherein the first and second insulating layers are made of an inorganic insulating material, and
    the third insulating layer is made of an organic insulating material.

5. The display panel of claim 1, wherein a thickness of the third insulating layer is larger than that of the second insulating layer.

6. The display panel of claim 1, wherein a thickness of the third insulating layer disposed at the area overlapped with the depression point is larger than a thickness of the third insulating layer at a remaining portion of the third insulating layer disposed in a second direction from the depression point, and a portion of the third insulating layer is disposed in the breakage at the depression point.

7. The display panel of claim 1, wherein the second insulating layer includes a non-disposed area of the second insulating layer at the depression point.

8. A display device comprising:
    a data driver driving a plurality of data lines;
    a gate driver driving a plurality of gate lines;
    a first conductive layer disposed on a substrate;
    a first insulating layer, a second conductive layer, and a second insulating layer sequentially disposed on the substrate and including step portions, respectively;
    a third insulating layer disposed on a part of a top of the second insulating layer; and
    a third conductive layer disposed on the substrate including the third insulating layer,
    wherein the step portions include a depression point, and the third insulating layer is disposed to overlap the depression point,
    wherein a thickness of the third insulating layer disposed at an area overlapped with the depression point is larger than a thickness of the third insulating layer at a remaining portion of the third insulating layer disposed in a second direction from the depression point, and
    wherein the second insulating layer includes a breakage at the depression point.

9. The display device of claim 8, wherein the third insulating layer is further disposed in a first direction from the depression point.

10. The display device of claim 8, wherein the third insulating layer is configured to be flat at an area corresponding to the step portion of the second insulating layer and residual areas other than the area corresponding to the step portion.

11. The display device of claim 9, wherein the first and second insulating layers are made of an inorganic insulating material, and
    the third insulating layer is made of an organic insulating material.

12. The display device of claim 8, wherein a thickness of the third insulating layer is larger than that of the second insulating layer.

13. The display device of claim 8, wherein thicknesses of the first and second insulating layers are the smallest at the depression point.

14. The display device of claim 8, wherein the second insulating layer includes a non-disposed area of the second insulating layer at the depression point.

15. The display panel of claim 1, wherein the third conductive layer contacts both the second insulating layer and the third insulating layer.

16. The display device of claim 8, wherein the third conductive layer contacts both the second insulating layer and the third insulating layer.

17. The display device of claim 8, wherein a portion of the third insulating layer is disposed in the breakage at the depression point.

* * * * *